(12) United States Patent
Hamada et al.

(10) Patent No.: US 12,394,723 B2
(45) Date of Patent: Aug. 19, 2025

(54) ALIGNMENT DEVICE AND ALIGNMENT METHOD

(71) Applicant: Hitachi High-Tech Corporation, Tokyo (JP)

(72) Inventors: Shohei Hamada, Tokyo (JP); Hidetoshi Nishiyama, Tokyo (JP); Atsushi Miki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 420 days.

(21) Appl. No.: 18/020,675

(22) PCT Filed: Aug. 31, 2020

(86) PCT No.: PCT/JP2020/032803
§ 371 (c)(1),
(2) Date: Feb. 10, 2023

(87) PCT Pub. No.: WO2022/044307
PCT Pub. Date: Mar. 3, 2022

(65) Prior Publication Data
US 2023/0326870 A1    Oct. 12, 2023

(51) Int. Cl.
*H01L 23/544* (2006.01)
*H01L 21/68* (2006.01)
(52) U.S. Cl.
CPC .......... *H01L 23/544* (2013.01); *H01L 21/681* (2013.01); *H01L 2223/54426* (2013.01)
(58) Field of Classification Search
None
See application file for complete search history.

(56) References Cited

U.S. PATENT DOCUMENTS

| 2005/0207639 A1 | 9/2005 | Horiuchi et al. |
| 2007/0114405 A1 | 5/2007 | Oosaki et al. |

(Continued)

FOREIGN PATENT DOCUMENTS

| JP | 8-14831 A | 1/1996 |
| JP | 2005-300322 A | 10/2005 |

(Continued)

OTHER PUBLICATIONS

International Preliminary Report on Patentability (PCT/IB/338 & PCT/IB/373) issued in PCT Application No. PCT/JP2020/032803 dated Mar. 9, 2023, including English translation of document C2 (Japanese-language Written Opinion (PCT/ISA/237), filed on Feb. 10, 2023) (six (6) pages).

(Continued)

*Primary Examiner* — Khaja Ahmad
(74) *Attorney, Agent, or Firm* — Crowell & Moring LLP

(57) ABSTRACT

This alignment device aligns a stage 10 and a wafer 50 by comparing alignment images captured by respective two chips of the wafer 50 on the stage 10. The alignment device comprises: the stage 10 that holds the wafer 50; an alignment illumination light source 60 that irradiates the wafer 50 held on the stage 10 with light; an alignment a image processing unit 67 that receives light from the wafer 50 and acquires the alignment images; an information input/output unit 4 that inputs and outputs information; and an alignment processing unit 3 that processes information from the image processing unit 67 for alignment information input/output unit 4. The (Continued)

alignment processing unit 3 sets an alignment image captured on a first wafer as a reference image, quantifies, on the basis of a difference obtained by comparing the reference image with an alignment image captured on a second wafer, sequential change information of a wafer surface state from a time when the first wafer is captured to a time when the second wafer is captured, and displays the quantified sequential change information on the information input/output unit 4.

12 Claims, 7 Drawing Sheets

(56) References Cited

U.S. PATENT DOCUMENTS

| | | | |
|---|---|---|---|
| 2011/0147587 A1 | 6/2011 | Yang et al. | |
| 2013/0044205 A1* | 2/2013 | Matsumoto | H04N 7/18 382/141 |
| 2018/0293720 A1* | 10/2018 | Yoshitake | G06T 7/001 |
| 2020/0227298 A1* | 7/2020 | Wang | H01L 24/89 |

FOREIGN PATENT DOCUMENTS

| | | | |
|---|---|---|---|
| JP | 2005-308727 | A | 11/2005 |
| JP | 2007-122995 | A | 5/2007 |
| JP | 2008-76147 | A | 4/2008 |
| JP | 2010-87070 | A | 4/2010 |
| JP | 4661075 | B2 | 3/2011 |
| JP | 2011-174757 | A | 9/2011 |
| JP | 2015-40698 | A | 3/2015 |
| WO | WO 2019/194064 | A1 | 10/2019 |

OTHER PUBLICATIONS

International Search Report (PCT/ISA/210) issued in PCT Application No. PCT/JP2020/032803 dated Nov. 17, 2020 with English translation (five (5) pages).
Japanese-language Written Opinion (PCT/ISA/237) issued in PCT Application No. PCT/JP2020/032803 dated Nov. 17, 2020 (four (4) pages).
Korean-language Office Action issued in Korean Application No. 10-2022-7046018 dated Nov. 4, 2024 with English translation (8 pages).

* cited by examiner

[FIG. 1]
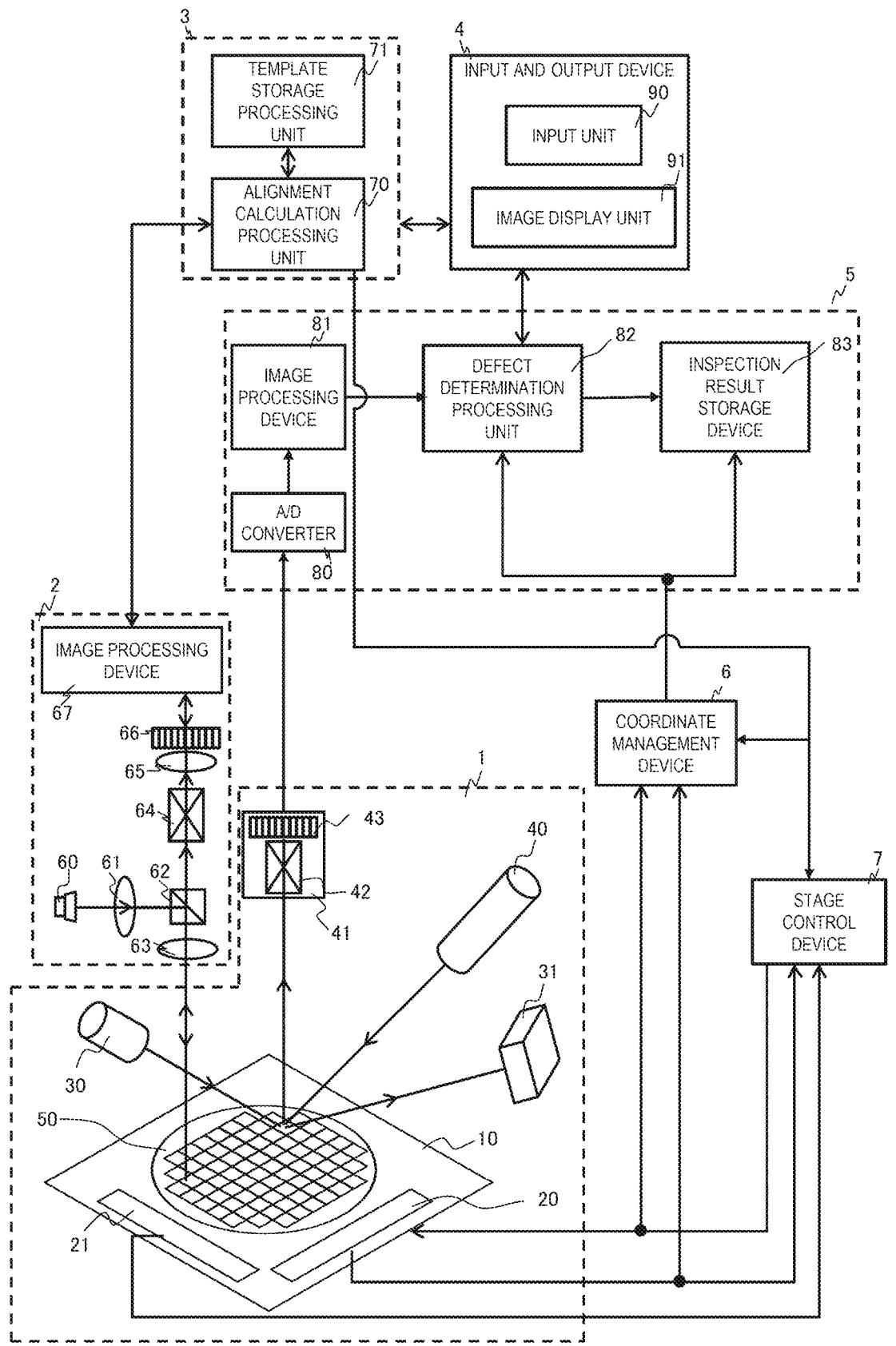

[FIG. 2]
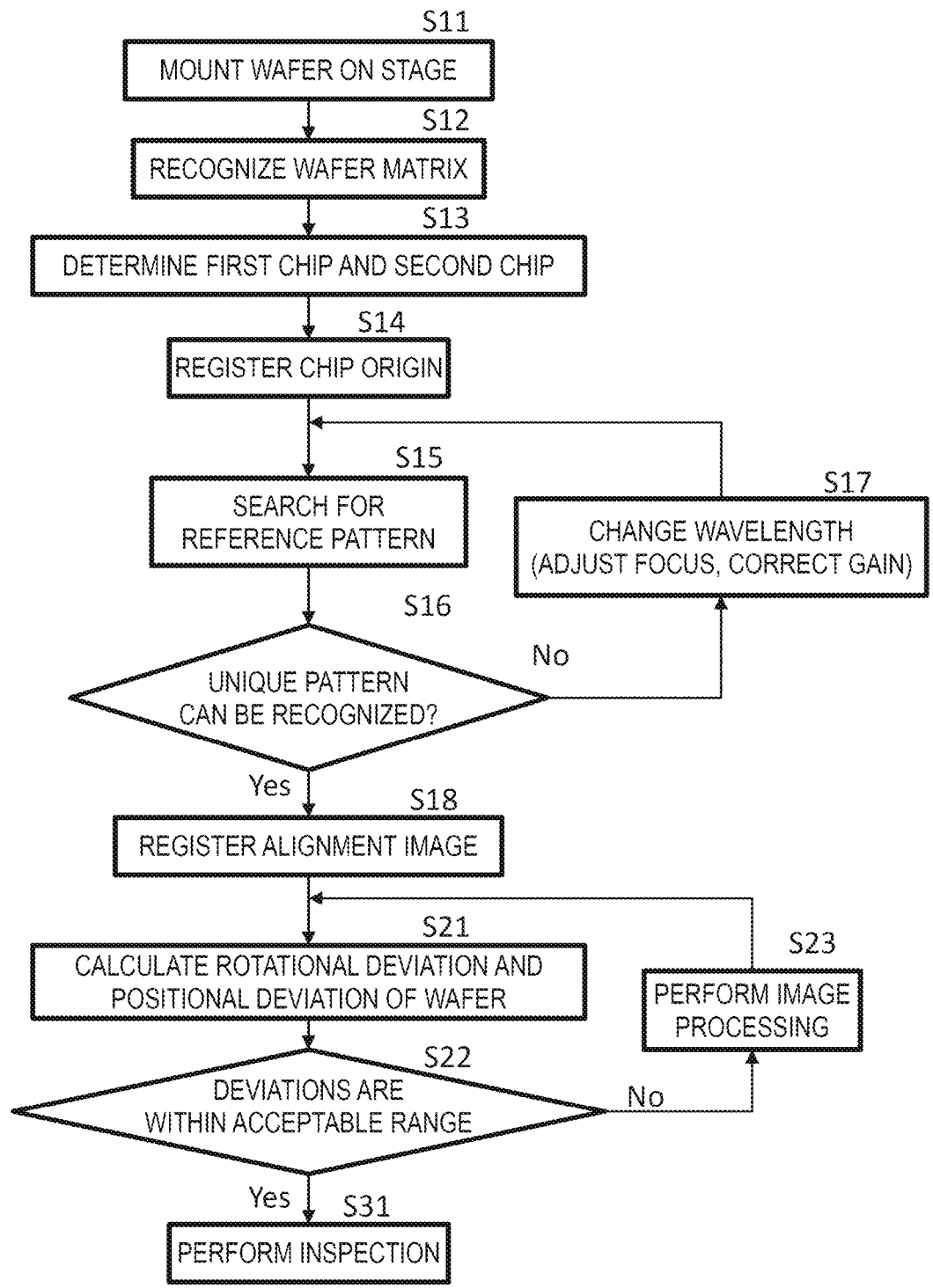

[FIG. 3]
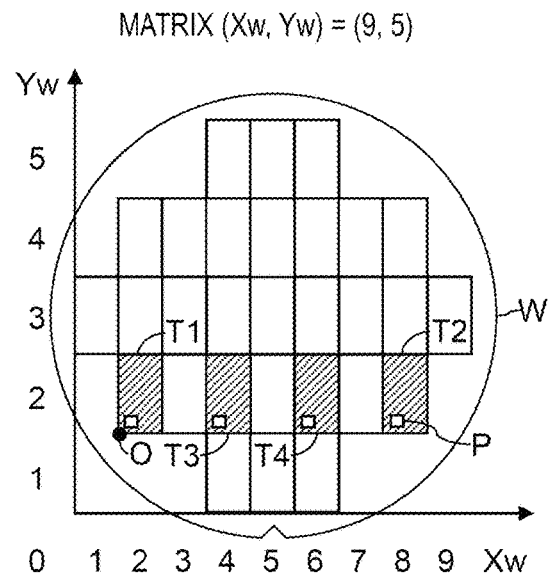
[FIG. 4]
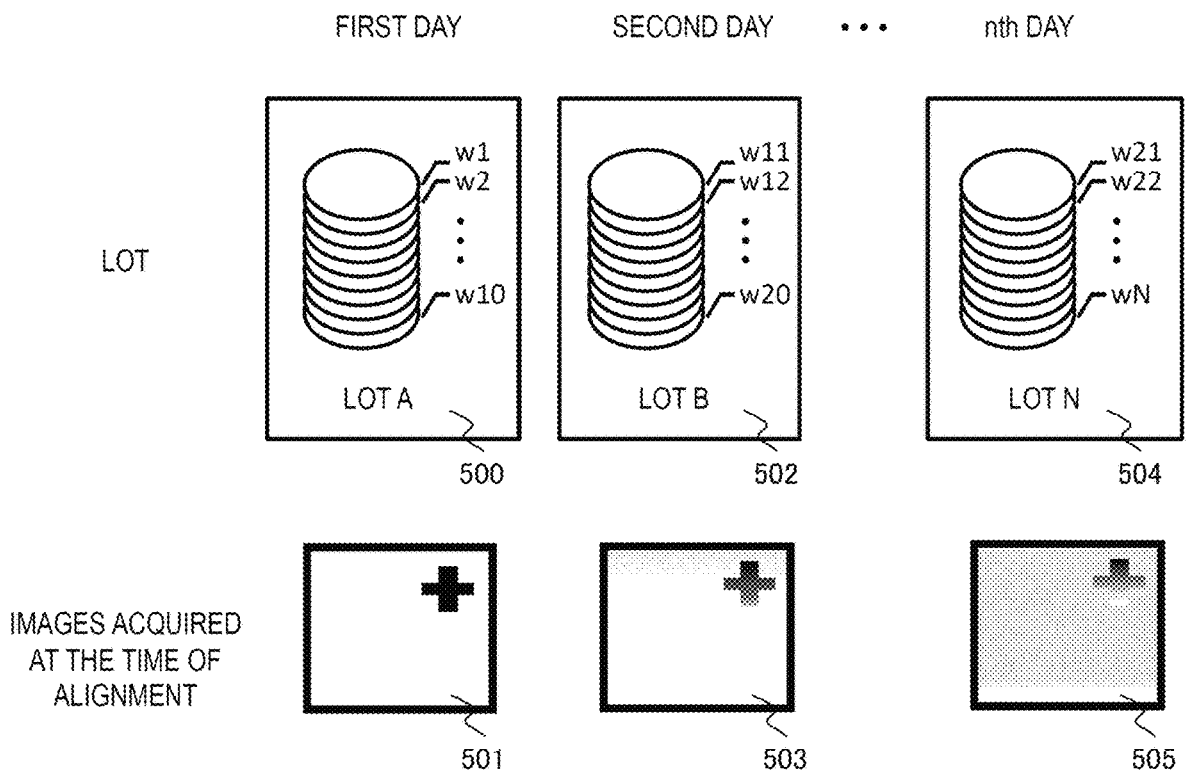

[FIG. 5]
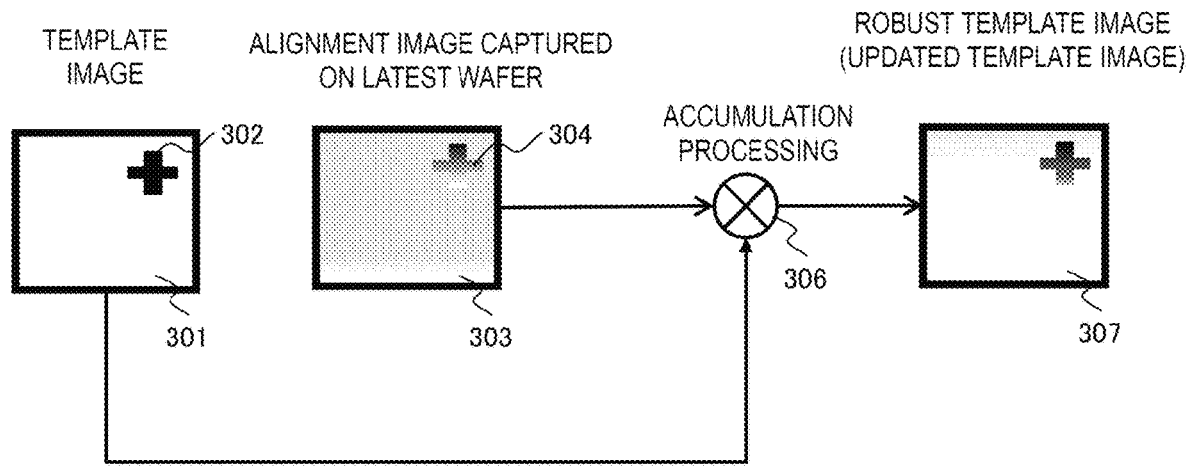
[FIG. 6A]
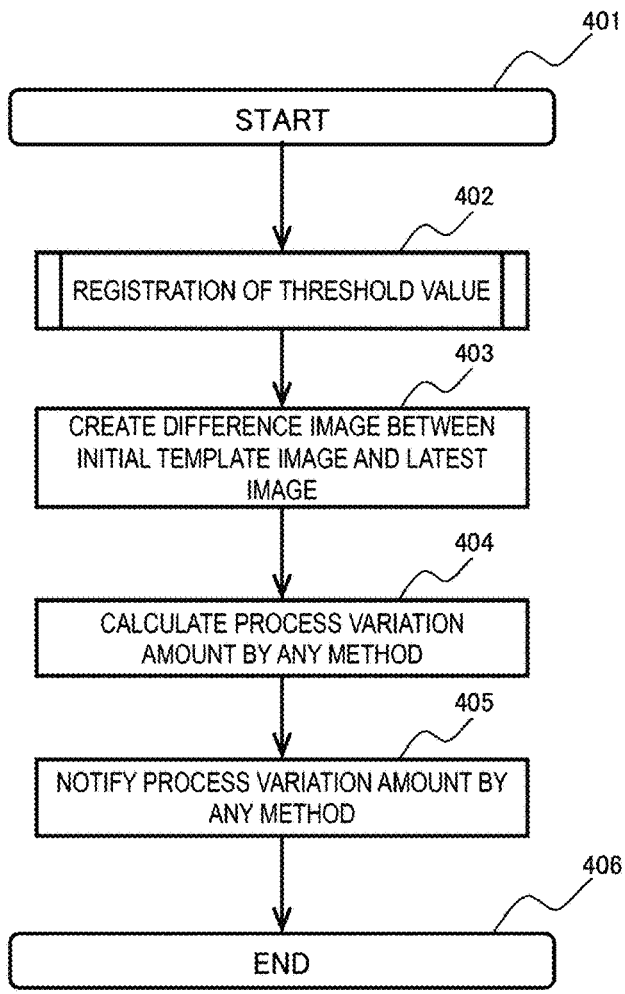

[FIG. 6B]
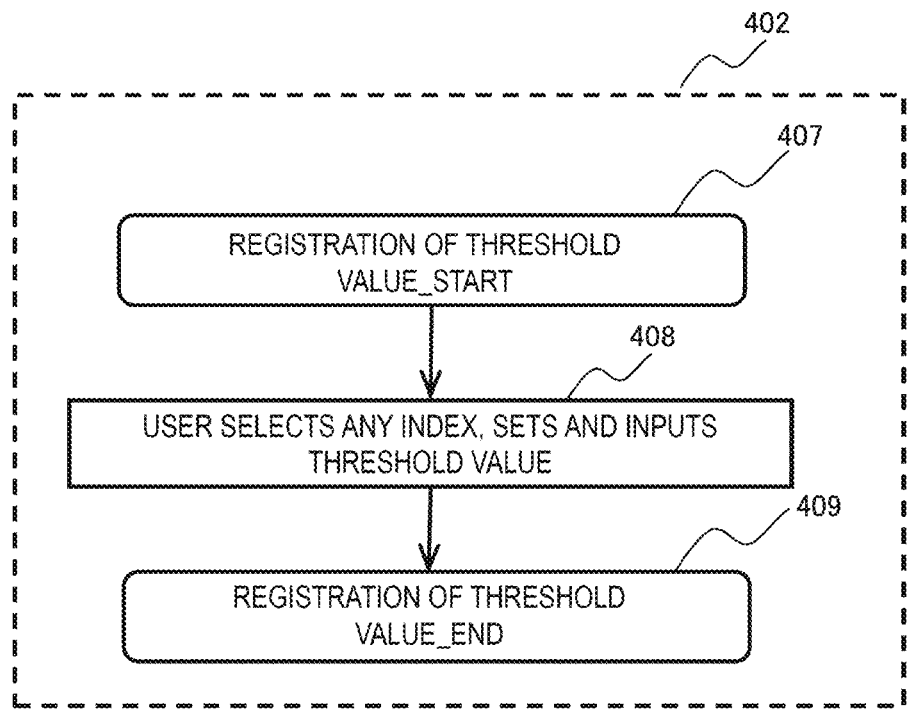
[FIG. 7A]
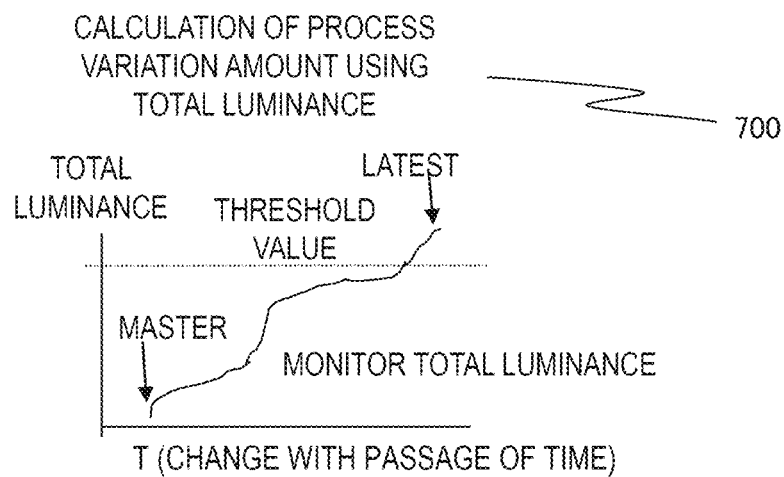

[FIG. 7B]
CALCULATION OF PROCESS VARIATION AMOUNT USING HISTOGRAM OF LUMINANCE — 701
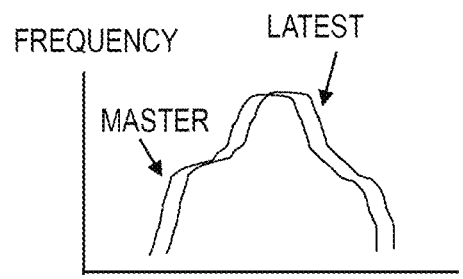
[FIG. 7C]
CALCULATION OF PROCESS VARIATION AMOUNT USING RGB LUMINANCE RATIO — 702
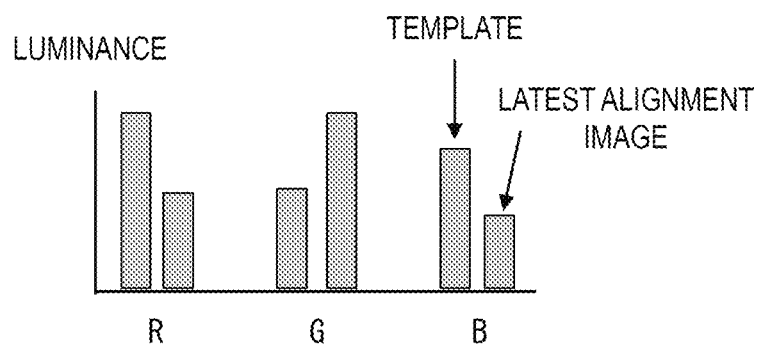

[FIG. 8]
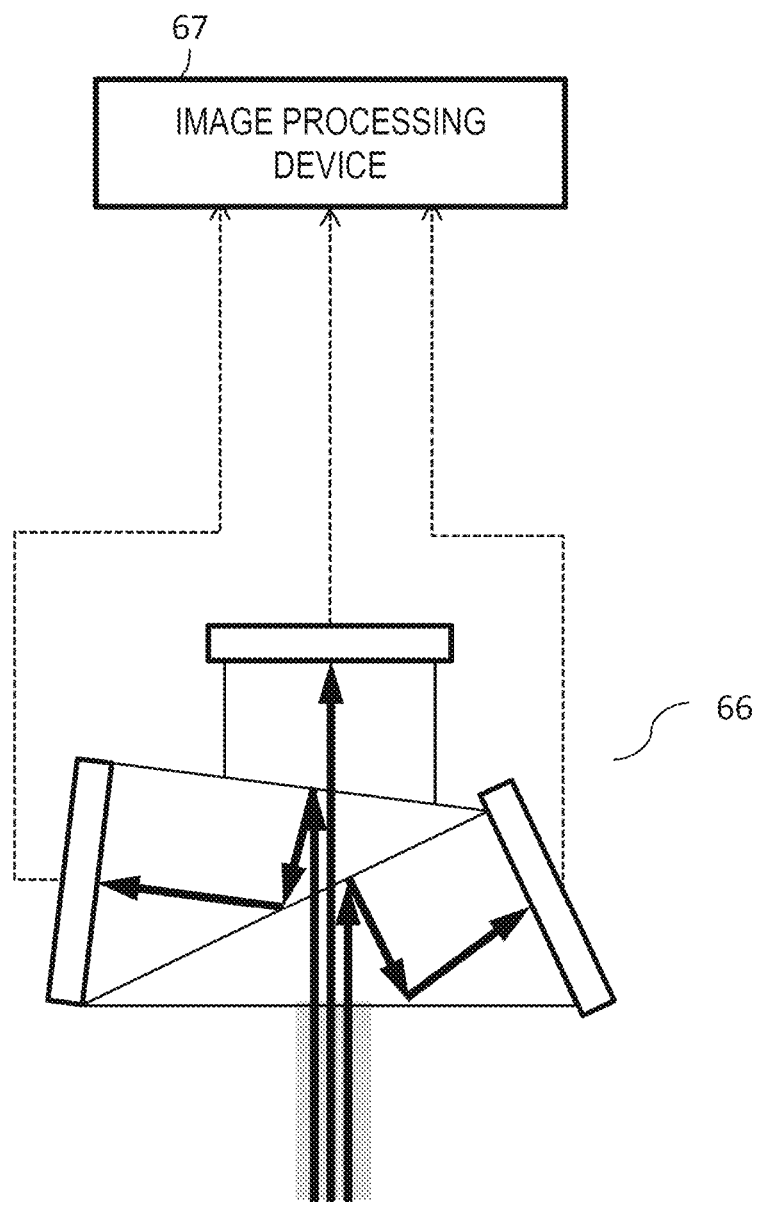

ALIGNMENT DEVICE AND ALIGNMENT METHOD

TECHNICAL FIELD

The present invention relates to an alignment device and alignment method that measure and adjust a positional an relation between a sample and a stage (for example, a patterned wafer with a film).

BACKGROUND ART

In a semiconductor manufacturing process, a pattern formed on a wafer (sample) or a defect (such as a scratch and a particle) on a surface of the wafer has a large influence on the yield. In order to manage the yield, it is important to detect and manage such a defect on the wafer by an in-line inspection and then feedback the defect to the semiconductor manufacturing process and a manufacturing apparatus.

However, when this defect inspection is performed by an inspection apparatus, there is a variation in the positional relation between the stage and the wafer loaded on the stage in a microscopical view, and if the positional relation between the stage and the wafer is not specified in advance, a defect inspection with high accuracy cannot be performed.

Therefore, an alignment device that measures the positional relation between the stage and the wafer loaded on the stage prior to the defect inspection, and performs alignment with high accuracy is provided in the inspection apparatus (see PTL 1).

CITATION LIST

Patent Literature

PTL 1: JP4661075B

SUMMARY OF INVENTION

Technical Problem

In the in-line inspection for semiconductor manufacturing, a defect or the like is inspected after a stage of an inspection apparatus and an inspection target wafer are aligned. In a wafer manufacturing process, periodic pattern regions (such as chips and cells) are formed in a lattice shape on a wafer.

When a wafer obtained by such a manufacturing line is inspected, a stage of a defect inspection apparatus, which has three axes including an X axis, a Y axis, and a @ axis, first aligns the θ axis of the stage with a center axis of the wafer, and then a defect is detected by inspecting the defect in the same direction as an arrangement direction of the pattern regions arranged in a lattice shape on the wafer.

In the alignment of the wafer and the stage, first, a unique mark (alignment mark) in a predetermined pattern region on the wafer is registered in advance, alignment mark images are acquired from two different pattern regions on an actual wafer loaded on the stage, coordinate values of alignment marks in the alignment images are collated, the θ axis is rotated such that the arrangement direction of the pattern regions is parallel to an inspection direction, and an inspection stage position is corrected.

In a semiconductor manufacturing line, even in the case of wafers that are processed using the same procedure by the same semiconductor processing apparatus, a subtle change occurs in a processing state of the wafers in a process in which the process apparatus is used on a daily basis. For example, in some cases, an internal environment of the semiconductor processing apparatus, which is in a good state for a while by performing cleaning of the inside of the apparatus or the replacement of a deteriorated member, naturally deteriorates over time, and a surface state of the processed wafers gradually changes. Such a natural change of the process apparatus with passage of time is not an abnormality in procedure management by a user but is an originally acceptable change amount.

However, in the alignment device of the defect inspection apparatus, an alignment image serving as a reference is acquired in advance, and the alignment image is used as a template image and is compared with an alignment image of a wafer to be actually inspected so as to perform an adjustment.

Therefore, in some case, when a change in a wafer surface state caused by a change of the process apparatus with passage of time is also recognized as a difference from the template image and the difference exceeds a certain amount, the change becomes an alignment error and the execution of alignment is stopped.

In the technique described in PTL 1, with respect to a problem that a template image for an alignment mark is formed in an early stage of manufacturing, and then is continuously used so that a difference is generated between an actual alignment mark image and the initial template image, there is disclosed an alignment method in which a process of calculating a matching score between an alignment mark image and a template image, and updating the template image to a latest image based on a predetermined threshold value is performed.

However, in the technique described in PTL 1, the matching score is a value obtained by comparing a coordinate value of a predetermined target portion of an alignment mark image of a wafer to be actually aligned with a coordinate value of the portion in the template image, and only positional information is taken into consideration in determining whether to update the template image.

However, in practice, a subtle change due to natural deterioration in the process apparatus described above cannot be determined according to the positional information of the alignment mark. The positional information is merely information necessary for aligning the stage and the loaded wafer, and contributes to improvement in positional accuracy, but does not represent the subtle change on the surface of the wafer.

Therefore, the problem described above of preventing the alignment error to be generated based on the change in the wafer surface state corresponding to the change of the process apparatus with the passage of time cannot be solved by the technique described in PTL 1.

An object of the invention is to provide an alignment device and an alignment method that quantitatively calculate a change in a surface state of a wafer due to a change of a semiconductor processing apparatus with passage of time and output a result of the change.

Solution to Problem

In order to achieve the above object, the invention is configured as follows.

Provided is an alignment device for comparing alignment images, each of which includes an alignment mark with each other and which are captured at at least two chips of a wafer held on a stage, to align the stage and the wafer. The alignment device includes: the stage configured to hold the wafer; an alignment illumination light source configured to irradiate the wafer held on the stage with light; an alignment image processing unit configured to receive light from the wafer and acquire the alignment images of the wafer; an information input and output unit configured to input and output information to and from a user; and an alignment processing unit configured to process information from the alignment image processing unit and the information input and output unit. The alignment processing unit sets an alignment image captured on a first wafer as a reference image, quantifies, on the basis of a difference obtained by comparing the reference image with the alignment image captured on a second wafer, information on a change of a wafer surface state with passage of time from a time when the alignment image of the first wafer is captured to a time when the alignment image of the second wafer is captured, and displays, on the information input and output unit, the quantified information on the change of the wafer surface state with the passage of time.

Provided is an alignment method for comparing alignment images, each of which includes an alignment mark with each other and which are captured at at least two chips of a wafer held on a stage, to align the stage and the wafer. The alignment method includes: irradiating the wafer held on the stage with light; receiving light from the wafer and acquiring the alignment images of the wafer; and setting an alignment image captured on a first wafer as a reference image, quantifying, on the basis of a difference obtained by comparing the reference image with an alignment image captured on a second wafer, information on a change of a wafer surface state with passage of time from a time when the alignment image of the first wafer is captured to a time when the alignment image of the second wafer is captured, and displaying, on the information input and output unit, the quantified information on the change of the wafer surface state with the passage of time.

Advantageous Effects of Invention

According to the invention, it is possible to provide the alignment device and the alignment method that quantitatively calculate a change in a surface state of a wafer due to a change of a semiconductor processing apparatus with passage of time and output the change. Accordingly, it is possible to inhibit an event that the alignment error occurs even though the change is not an abnormality for the user.

BRIEF DESCRIPTION OF DRAWINGS

FIG. 1 is a schematic configuration diagram of a defect inspection apparatus according to an embodiment of the invention.

FIG. 2 is a flowchart illustrating a procedure of defect inspection that includes a procedure of automatic image capturing for an alignment image.

FIG. 3 is an explanatory diagram of a pattern on a wafer as a reference.

FIG. 4 is a conceptual diagram illustrating a change of a semiconductor processing apparatus with passage of time in a semiconductor manufacturing line and a change in a wafer surface state caused by the change.

FIG. 5 is a conceptual diagram of a process of updating a template image in accordance with a latest state when alignment is performed.

FIG. 6A is a flowchart illustrating a process in quantitatively grasping a change amount of the wafer surface state due to the change of the process apparatus with the passage of time and providing the change amount as information to a user.

FIG. 6B is a detailed diagram of step 402 shown in FIG. 6A.

FIG. 7A is a conceptual diagram for quantifying a process change amount based on luminance of an alignment image.

FIG. 7B is a conceptual diagram for quantifying the process change amount based on a luminance histogram of the alignment image.

FIG. 7C is a conceptual diagram for quantifying the process change amount based on an RGB luminance ratio of the alignment image.

FIG. 8 is a diagram in which an alignment sensor and an image processing device of an alignment image capturing unit are extracted and shown.

DESCRIPTION OF EMBODIMENTS

Hereinafter, embodiments of the invention will be described with reference to the drawings.

Embodiments

FIG. 1 is a schematic configuration diagram of a defect inspection apparatus according to an embodiment of the invention.

The defect inspection apparatus according to the present embodiment includes an inspection mechanism unit 1, an alignment image capturing unit 2 that captures an alignment image, an alignment system (alignment processing unit) 3 that calculates a coordinate correction amount by collating a captured alignment image with an alignment image (template image) to be a reference registered in advance, and performs alignment of coordinates, an input and output device (information input and output unit) 4 that inputs and outputs information on operation input and screen display of the defect inspection apparatus with a user, a defect determination unit 5 that calculates a defect signal based on an image signal acquired from a sample by the inspection mechanism unit 1 and stores a result thereof, a stage 10 on which the sample is placed, a coordinate management device 6 that stores and outputs coordinate information of the stage 10, and a stage control device 7 that controls the stage 10.

First, the inspection mechanism unit 1 will be described. The inspection mechanism unit 1 includes a light source 40, the stage 10 on which a sample 50 (for example, a wafer) is placed, and a light receiving unit 41 (at least one is provided) that receives reflected light or scattered light from the sample 50 and converts the reflected light or the scattered light into an image signal. The light source 40 emits light to the sample 50 held on the stage 10 to form an illumination region on the sample 50.

For example, a mirror or a lens (both of which are not shown) can be disposed between the light source 40 and the sample 50, and a shape of the illumination region can be changed by driving the mirror or the lens, for example, the shape can be a point-like shape or a linear shape.

The stage 10 is for holding a wafer (for example, a patterned wafer with a film) to be the sample 50, and includes a chuck, a Y stage, an X stage, a Z stage, and a θ stage. The chuck is for adsorbing and holding the wafer. The wafer is placed (loaded) on the chuck of the stage 10 by a robot arm of a wafer transfer apparatus. The wafer transfer apparatus includes a wafer pod, a pre-aligner, and the like in addition to the robot arm.

The Y stage is a driving unit that moves the chuck in a Y axis direction. The X stage is a driving unit that moves the chuck in an X axis direction, and the Z stage is a driving unit that moves the chuck in a Z axis direction, and the θ stage is a driving unit that rotates the chuck around a Z axis. Accordingly, the wafer mounted on the chuck can be moved in parallel in X, Y, and Z directions, and can be rotated in an XY plane.

An X axis and a Y axis are, for example, coordinate axes orthogonal to each other in a horizontal plane, and the Z axis is an axis orthogonal to the XY plane. The stage 10 is also provided with mechanisms for measuring a stage position. Specifically, the stage 10 includes an X scale 20 for position measurement of the X stage, a Y scale 21 for position measurement of the Y stage, an auto-focus (AF) illumination unit 30 for measuring a height at which the sample is placed and a Z direction of the Z stage, and an AF light receiving unit 31 for measuring a position of the Z direction based on reflected light or scattered light from an object to be inspected which is emitted by the auto-focus illumination unit 30.

The light receiving unit 41 includes a condenser lens 42 and a light receiving sensor 43. Reflected light or scattered light from the illumination region formed on the sample 50 is condensed by the condenser lens 42. Unnecessary light of the light condensed by the condenser lens 42 is blocked by a spatial filter (not shown), and light passing through the spatial filter is imaged on a light receiving surface of the light receiving sensor 43 via an imaging lens (not shown). In this way, the light receiving sensor 43 receives the light from the wafer serving as the sample 50. A signal output from the light receiving sensor 43 in response to light reception is transmitted to the defect determination unit 5.

The defect determination unit 5 will be described. The defect determination unit 5 includes an A/D converter 80 that extracts a signal transmitted from the light receiving unit 41 of the inspection mechanism unit 1, an image processing device 81 that combines a partial image signal of the A/D converter 80 in a chip unit, a defect determination processing unit 82 that determines a defect based on information from the image processing device 81, and an inspection result storage device 83 that generates and stores defect information (information such as a defect size and coordinate information) obtained by the defect determination processing unit 82 and the coordinate management device 6 to be described later.

The defect determination processing unit 82 compares an inspection image acquired from the image processing device 81 with an image of a pattern region of the inspection image, for example, with an image of an adjacent chip in the case where the inspection image is an image in chip units, and identifies a defect signal.

The alignment image capturing unit 2 that acquires an alignment image will be described. The alignment image capturing unit 2 includes an alignment illumination light source 60, a condenser lens 61 for condensing light from the alignment illumination light source 60, a beam splitter 62 having a property of splitting and transmitting an illumination beam passing through the condenser lens 61, and a diffusion and condenser lens 63. The diffusion and condenser lens 63 spreads light from the beam splitter 62 to illuminate the sample (wafer) 50. The reflected light or the scattered light from the illuminated sample 50 is condensed by the diffusion and condenser lens 63, passes through a relay lens 64 (here, a magnification may be changed) after transmitting the beam splitter 62, is spread by a diffusion and condenser lens 65, and then is received by an alignment sensor 66.

A signal received by the alignment sensor 66 is transmitted to an image processing device (alignment image processing unit) 67, an image signal is generated, and an alignment image of a predetermined pattern region of the sample 50 is acquired.

The alignment image capturing unit 2 captures an alignment image serving as a reference in advance, and the captured alignment image is processed by the image processing device 67 and an alignment calculation processing unit 70, and then is stored as a template image in a template storage processing unit 71.

The alignment system 3 that uses the template image to collate with an alignment image of a wafer to be actually inspected, and calculates a coordinate correction amount of the stage 10 will be described. The alignment system 3 performs registration of a template image, collation between an alignment image acquired on a wafer to be inspected and a registered template image, screen display output to the input and output device 4, and transmission of a coordinate correction amount to the stage control device 7, which will be described later, in order to correct a stage coordinate based on a collation result.

The transmission of the coordinate correction amount to the stage control device 7 is performed by the alignment calculation processing unit 70 of the alignment system 3. The alignment calculation processing unit 70 performs various types of calculation processing using an alignment image, in addition to transmission of an acquired alignment image, image accumulation processing for accumulating an alignment image as data, update processing of a template image to be described later, and calculation of a change amount in a wafer state using an alignment image.

In addition, if necessary, the alignment calculation processing unit 70 is also connected to the input and output device 4 in order to notify a user of an alignment mark acquisition screen, an alignment image, and a result of a process using an alignment image, and can be allowed to appropriately display information on alignment by the input and output device 4.

The inspection mechanism unit 1 of the defect inspection apparatus, an operation related to the alignment image capturing unit 2 and the input and output device 4 performing various screen displays will be described. The input and output device 4 includes an input unit 90 capable of instructing an operation of the alignment system 3 and the defect determination unit 5 to be described later, and an image display unit 91 for displaying the input unit 90, the various results described above, and the like.

FIG. 2 is a flowchart illustrating a procedure of defect inspection that includes a procedure of automatic image capturing for an alignment image. Steps S12 to S18 in FIG. 2 show the procedure of automatic image capturing of an alignment image, steps S21 to S23 show a procedure for alignment, and step S31 shows the procedure of defect inspection.

When the process of FIG. 2 is started, the defect inspection apparatus first drives the wafer transfer apparatus to load (mount) the wafer 50 at a predetermined position of the stage 10 (step S11). Thereafter, the defect inspection apparatus drives the stage 10 by the stage control device 7 to move the wafer 50 into a visual field of the alignment image capturing unit 2, and the alignment image capturing unit 2 performs alignment processing (steps S12 to S18 and S21 to S23).

The alignment image capturing unit 2 captures an image of the entire wafer 50 by using the alignment illumination light source 60, the alignment sensor 66 and the like to acquire an image, and recognizes a wafer matrix formed on the wafer 50 (step S12). The image acquisition is performed by scanning the wafer 50 in a concentric circular form or a spiral form (by driving the θ stage and the X stage) in an Rθ coordinate system of the stage 10.

An image can be acquired by scanning the wafer 50 in an XY coordinate system (by driving the X stage and the Y stage). For example, a repetition distance (pitch) for a pattern in an Xw axis direction (shown in FIG. 3) and a Yw axis direction (shown in FIG. 3) is calculated by image processing from the acquired image. Then, the calculated repetition distance is set as a chip size, and the wafer matrix is recognized based on the chip size. The wafer matrix is recognized by the alignment system 3.

As illustrated in FIG. 3 which is an explanatory diagram of a pattern on the wafer 50 as a reference, the wafer matrix is a form in which multiple chips of the same type (semiconductor devices also referred to as chips) on a wafer W are arranged in two directions (Xw axis direction and Yw axis direction) of an orthogonal coordinate system and form a matrix. FIG. 3 illustrates an example of a matrix (Xw, Yw)=(9, 5).

After recognizing the wafer matrix, the alignment system 3 determines a first chip T1 and a second chip T2 in the wafer matrix (step S13), as shown in FIG. 3. After determining the chips T1 and T2, the alignment system 3 registers a coordinate of a chip origin O (for example, a starting point of the repetition for a pattern) of the chip T1 in a memory (not shown) (step S14).

A reference pattern (alignment mark) P (FIG. 3) is a pattern located at a certain distance from the chip origin O to ΔX1 in an X coordinate and ΔY2 in a Y coordinate, and the ΔX1 and the ΔY2 are stored in advance in the memory as information at the time of alignment. The chips T1 and T2 are chips to be references for measuring a rotational deviation of the wafer 50, and have the same Yw coordinate on the wafer matrix (placed on the same axis parallel to an Xw axis on the wafer W).

The chips T1 and T2 are preferably chips as separate from each other as possible from the viewpoint of correction accuracy for the rotational deviation of the wafer 50. However, in this case, if the rotational deviation of the wafer 50 is large, there is a case where, when an observation position moves from the chip T1 to the chip T2, the chip T2 is deviated from the visual field and an operation of searching for an alignment pattern image is necessary, and it takes time to recognize the image.

In the example of FIG. 3, an example in which four chips (first to fourth chips T1 to T4) having the same Yw coordinate are selected is illustrated. In this case, an inter-chip distance can be extended, for example, in such a manner that the alignment is first performed in the chips T3 and T4 having a short inter-chip distance, then the alignment is performed in the chips T3 and T2, and further is performed in the chips T2 and T1. Accordingly, the rotational deviation of the wafer 50 can be further accurately corrected, and the time required for the alignment operation can be shortened.

Next, the alignment system 3 searches for a unique reference pattern P (alignment mark) in each selected chip (step S15), and determines whether each reference pattern P can be recognized (whether a contrast is equal to or greater than a set value) (step S16).

When there is a reference pattern P by which an image cannot be recognized with a low contrast, the alignment system 3 acquires a new image of the wafer 50 (step S17). At this time, the depth of focus of illumination light may be changed by driving the stage 10, or the brightness or the contrast of the image may be adjusted by correcting a gain of a sensor signal used for generating an image. As an example, a combination of a focus position and a gain may be prepared in advance, and a combination of a sensor and an aperture opening degree may be changed for each combination of the focus position and the gain. As a result of changing an image capturing condition as necessary, when an image with sufficient luminance and contrast is acquired and the reference pattern P can be clearly recognized, the alignment system 3 registers the image. In a defect inspection apparatus operated in the manufacturing line, an initially registered alignment image may be used as a template image in the same inspection procedure. When a predetermined wafer for single use is inspected, one of registered alignment images may be used as a template image.

An alignment image (template image) to be a reference is registered in the template storage processing unit 71 (step S18). After completing acquiring the alignment image by the chip T1, the stage control device 7 sequentially captures clear alignment images of the reference patterns P in the chips T1 to T4 (at least the chips T1 and T2) by the alignment image capturing unit 2 while driving the stage 10 to move the wafer 50, and registers the images.

When the registration of necessary alignment images is completed, the alignment system 3 performs the alignment processing (step S21). As the alignment processing, a positional deviation of a center of f the wafer W from a rotational center of the stage 10 and the rotational deviation of the wafer 50 are first calculated in the coordinate system of the stage 10. The contents of the alignment processing are described in detail in JP2015-40698A, and the same processing can be adopted in the present embodiment. However, in the present embodiment, since the reference patterns P can be recognized well through the procedure of step S16, and thus the rotational deviation (deviation in a θ direction) of the wafer 50 can be calculated using the reference patterns P, instead of the method disclosed in JP2015-40698A. The method will be described hereinafter.

In the example illustrated in FIG. 3, the reference patterns P of the chips T1 to T4 are arranged along the Xw axis, and have the same Yw coordinate. Therefore, a straight line passing through the four reference patterns P is parallel to the Xw axis of a wafer coordinate system.

Thus, by calculating a slope in a stage coordinate system (Rθ coordinate system or XY coordinate system) of the straight line passing through the four reference patterns P, the rotational deviation (slope) of the wafer 50 can be calculated. In order to acquire a straight line parallel to the Xw axis, it is sufficient to select two reference patterns P along the Xw axis. However, in the present embodiment, four reference patterns P are selected. When three or more reference patterns P are selected, for example, a plurality of straight lines passing through two reference patterns P among the three or more reference patterns P are acquired by changing the selection of the reference patterns P and then statistical processing is performed to increase parallelism of the acquired straight lines with respect to the Xw axis.

Therefore, in the case where the straight line passing through the reference patterns P is acquired by selecting three or more reference patterns P, the influence of a manufacturing error caused by the chip of the wafer W is reduced. As the number of the selected reference patterns P increases, calculation accuracy of the rotational deviation increases while calculation load increases, and thus in FIG.

3, a case where the four reference patterns P are selected in consideration of both the accuracy and the calculation load is illustrated.

The number of the reference pattern P is not limited as long as multiple reference patterns P having the same Yw coordinate can be selected, and the setting of the number of the selected reference patterns P can be changed as appropriate. In FIG. 3, a selection example of the reference pattern P for acquiring a straight line parallel to the Xw axis is illustrated, and multiple reference patterns P may be selected along a Yw axis. The rotational deviation of the wafer W can also be calculated according to a slope in the Yw axis in the stage coordinate system (Rθ coordinate system or XY coordinate system).

After calculating the rotational deviation of the wafer 50 and the positional deviation of the center thereof, the alignment system 3 determines whether these deviations are within a preset acceptable value (step S22). It is changeable between a case of determining that an acceptable range is exceeded when both the rotational deviation and the positional deviation of the center exceed the acceptable value and a case of determining that the acceptable range is exceeded when any one of the rotational deviation and the position deviation of the center exceeds the acceptable value, and the latter is adopted here.

When any one of the rotational deviation and the positional deviation of the center exceeds the acceptable value, the alignment calculation processing unit 70 performs image processing of correcting at least one of a position and an angle of the alignment image to bringing the wafer coordinate system close to the stage coordinate system (step S23), and returns the process to step S21. As a result of executing the image processing as necessary, both the rotational deviation and the positional deviation are within the acceptable value, and when desired inspection accuracy can be secured, a signal is transmitted from the alignment system 3 to the stage control device 7. When an alignment completion signal is input from the alignment system 3 in this manner, the stage control device 7 performs the defect inspection of the wafer 50 using the light source 40 and the light receiving unit 41 while driving the stage 10 (step S31).

FIG. 2 illustrates a procedure in an automatic mode, and the image capturing condition may be manually input and set freely by the user, and the procedures of step S18 and the subsequent steps are the same even in the case of a manual mode.

Next, alignment in an actual semiconductor manufacturing line will be described. In the semiconductor manufacturing line, the defect inspection is set between a predetermined procedure and a procedure, and management is performed based on whether there is an abnormality in an immediately preceding procedure processing, whether a defect leading to a failure is generated, a defect inspection result, or a trend of the number of defects.

In such an in-line defect inspection apparatus, a lot of wafers being transferred to the manufacturing line are cycled on a daily basis. It is inefficient to perform registration of the chip origin, formation of the wafer matrix, registration of the alignment image (template image) to be a reference and the like described above each time a lot of wafers are cycled.

Therefore, there is a case where basic information necessary for alignment is registered in an initial inspection and is used for subsequent inspections. For example, an alignment image acquired in the initial inspection may be registered as a template image, and thereafter, in the same procedure, the same template image may be continuously used for several weeks, several months, or more periods to perform the alignment.

However, if the same template image is used for several weeks, several months, or for a long period of time, harmful influences also appear. Specifically, a condition of the process apparatus in the semiconductor manufacturing line may gradually change (deteriorate) over time. Therefore, in the semiconductor manufacturing line, maintenance (including cleaning) of the process apparatus used for a certain period of time is performed to improve the condition. Although the defect inspection is performed on a daily basis in a period from the maintenance to the next maintenance, a matching rate of the alignment image may decrease with the elapse of the period with respect to the initially acquired template image. This is because the surface state of the wafer gradually changes due to degradation of the condition with passage of time inside the process apparatus.

FIG. 4 is a conceptual diagram illustrating the change of the semiconductor processing apparatus with the passage of time in the semiconductor manufacturing line and the change in the wafer surface state caused by it. In FIG. 4, as described above, a day when a lot A (500) of wafers subjected to the same process procedure are inspected is set as a reference and the day is set as the first day, the lot A (500) of wafers inspected on the first day is denoted by w1, w2, . . . , and w10. A lot B (502) inspected on a second day is set as a set of wafers (w11, w12, . . . , w20), and a lot N (504) after the lapse of n days from the lot B (502) is set as a set of wafers (w21, w22, . . . , WN).

Changes between lots inspected on different days will be described. For the wafers of the lot A (500), the lot B (502), and the lot N (504), an alignment image (501) acquired in the lot A (500) on the first day, an alignment image (503) acquired in the lot B (502) on the second day and an alignment image (505) acquired in the lot N (504) after the lapse of n days are illustrated. Cross marks shown in the alignment images (501, 503, and 505) are reference patterns (alignment marks).

The appearance of the alignment images (501, 503, and 505) is different depending on the days when the alignment images are acquired. FIG. 4 shows an example in which gray levels and contours of the alignment images (501, 503, and 505) are changed.

For example, in the defect inspection after a film formation procedure, even though it is seen as having the same film thickness, the film thickness subtly changes and the film thickness is not uniform, so that the gray levels and the contours of the alignment image change. In addition, a matter may be listed as an example that in an apparatus for processing a surface by using plasma, a chamber inside the apparatus is worn due to the exposure to the plasma, and residues gradually stack in the chamber, so that a state inside the chamber changes.

As described above, since the state of the process apparatus in an immediately preceding procedure with respect to the inspection changes, when the alignment image is acquired on the wafers of the lot N after n days elapsed from the day when the template image is initially acquired, the matching rate may decrease by a certain level or more with respect to the template image. The defect inspection apparatus recognizes this case as an error. When such an alignment error occurs, the defect inspection apparatus stops the alignment.

However, such a natural change of the process apparatus with passage of time is not an abnormality in the procedure management by the user but an originally acceptable change amount as long as the natural change does not exceed a certain level, and the alignment error due to the change in the surface state of the wafer caused by the natural change is originally not an error. It is an undesired stop for the user that the defect inspection apparatus recognizes the alignment error as an error and then stops the process, even though the alignment error is not an error.

In order to prevent such an alignment error, it is necessary to update a template image in accordance with a latest surface state of the wafer. Such an updated template image robust against the influence of the change of the process apparatus with the passage of time is hereinafter referred to as a robust template image.

FIG. 5 is a conceptual diagram of a process of updating the template image in accordance with a latest state when the alignment is performed. The template image is updated by the alignment calculation processing unit 70.

In FIG. 5, first, there is an initially registered template image 301 (alignment image captured on a first wafer). The template image 301 includes a unique reference pattern (alignment mark) 302 in the chip.

Next, an alignment image 303 (alignment image captured on a second wafer) is acquired on a latest wafer that is currently placed on the defect inspection apparatus. At this time, the defect inspection apparatus searches for the same alignment mark as the template image 301, and acquires the alignment image 303 including an alignment mark 304. Then, the alignment mark 302 of the template image 301 and the alignment mark 304 of the alignment image 303 acquired on the latest wafer are collated and aligned, and any accumulation processing (calculation processing) 306 is performed based on a difference acquired by comparing the template image 301 with the alignment image 303.

By the accumulation processing 306, a robust template image (second reference image) 307 is generated. The "any accumulation processing 306" referred to here is, for example, a method of first superimposing the template image 301 and the alignment image 303 acquired on the latest wafer which are aligned with each other, averaging luminance of pixels located at the same position, and generating a new luminance value.

In addition, the accumulation processing 306 also may be a method of not only collating the pixels at the same position with each other in a one-to-one correspondence, but also creating a new luminance value by using a median when luminance values of all pixels of a plurality of pixel groups at the same position are arranged.

It is possible to further reduce a noise influence by using a luminance value of a certain region formed by a plurality of pixel groups. In this case, for example, a robust image may be created by summing a value acquired by multiplying pixels of the template image 301 by a weighting factor of 0.7 and a value acquired by multiplying pixels of the alignment image 303 acquired on the latest wafer by a weighting factor of 0.3.

As described above, the template image 307 in accordance with the surface state of the latest wafer is updated, the change with the passage of time that is originally not an abnormality is caused to have robustness, and an undesired alignment error is prevented.

Next, the present inventor has found a problem that regarding the change that since the condition of the process apparatus in the immediately preceding procedure gradually changes, the surface state of the wafer inspected by the defect inspection apparatus also gradually changes over time, it is possible to quantitatively grasp the change by the alignment image and notify the user of the change. A method for solving this problem will be described below.

FIG. 6A is a flowchart illustrating a process in quantitatively grasping a change amount of the wafer surface state due to the change of the process apparatus with the passage of time (hereinafter, referred to as a process change amount) and providing the change amount as information to the user.

In FIG. 6A, the process starts in step 401. The process at the time of providing the information on the process change amount first sets an acceptable upper limit value (threshold value) as the process change amount (step 402 (details of step 402 will be described later with reference to FIG. 6B)). In the present embodiment, the process change amount is managed based on any reference (threshold value), and a notification timing is determined based on whether the process change amount is equal to or less than the reference, or exceeds the reference.

As a specific example, for example, when the process change amount is acquired based on the luminance of the alignment image, as shown in FIG. 7A, it is understood that total luminance of the alignment image is set as a vertical axis, the time is set as a horizontal axis, and when the total luminance of the alignment images of the wafers inspected on a daily basis is stored and plotted, the total luminance gradually increases as the day elapses. Such storage and calculation processing are performed by the alignment calculation processing unit 70. When an amount of the total luminance gradually increased exceeds a threshold value, the user is notified that the process change amount exceeds a certain amount.

The total luminance is described as an example of an index, and the index is not limited to the total luminance. Since the index which is particularly likely to change on the alignment image is different according to the procedure (process apparatus) to be inspected, the user can select an index particularly desired to be monitored by using the alignment image in accordance with each procedure.

Therefore, in the registration of the threshold value (Step 402), as shown in FIG. 6B, when the registration of the threshold value is started in Step 407, the user selects any index, sets and inputs a threshold value by the input and output device 4 (Step 408), and then registers the threshold value by the input and output device 4 (Step 409).

When the setting of the threshold value in step 402 is completed, a difference image between the initially acquired template image and the alignment image acquired on the latest inspected wafer is created (step 403). The alignment calculation processing unit 70 calculates the process change amount based on these images by any method to be described later (step 404).

Thereafter, the alignment calculation processing unit 70 sends the calculated process change amount to the image display unit 91, and the image display unit 91 notifies the process variation amount in the screen by any method (step 405).

That is, based on a difference obtained by setting the alignment image 301 captured on the first wafer as a reference image, comparing the alignment image 303 captured on the second wafer with the alignment image 301 severing as the reference image, the information on the change of the wafer surface state with the passage of time from the time when the alignment image of the first wafer is captured to the time when the alignment image of the second wafer is captured is quantified and displayed on the input and output device 4 serving as an input and output unit.

A value of the process change amount may be displayed every time the wafer is inspected, or may be displayed as a transition for a certain period of time. Alternatively, as described above, the process change amount may be notified as an alarm when the process change amount exceeds the threshold value. For example, when the process change amount is monitored based on the index, that is, the amount of the total luminance of the alignment image described above, the amount of the total luminance is displayed on a screen display unit. By such a series of procedures, the process of quantifying the process variation amount and providing the process change amount as information to the user is completed (step 406).

Next, the method of calculating the process change amount shown in step 404 of FIG. 6A will be described. Examples of the method of calculating the process change amount include the method of calculating the process change amount using the total luminance of the alignment image described above (calculation of the process variation amount using the total luminance 700 shown in FIG. 7A), a method of acquiring a histogram of the luminance of the alignment image and calculating the process change amount based on the histogram (calculation of the process variation amount using the histogram of luminance 701 shown in FIG. 7B), and a method of acquiring an RGB luminance ratio based on luminance of colors (R:Red/G:Green/B:Blue) applied to the alignment image and calculating the process change amount based on the ratio (calculation of the process variation amount using the RGB luminance ratio 702 shown in FIG. 7C).

First, the method 700 of calculating the process change amount using the total luminance of the alignment image will be described. First, the alignment calculation processing unit 70 compares the luminance value of the template image stored in the template storage processing unit 71 with the luminance value of the alignment image acquired on the latest wafer, which is acquired by the alignment image capturing unit 2, in pixel units.

In the comparison, as described with reference to FIG. 5, the template image 301 and the alignment image 303 are subjected to the alignment processing, the template image 301 and the alignment image 303 acquired on the latest wafer are superimposed, and an image in which the superimposed images are cut out and positions of the images match each other is formed. In order to grasp a change amount of the luminance, the luminance values of the template image 301 and the alignment image 303 of the latest wafer are normalized.

Then, the alignment calculation processing unit 70 compares the normalized total luminance of the template image 301 with the normalized total luminance of the latest alignment image 303, and calculates the difference thereof. This differences are accumulated in a time-series manner, that is, a difference in the wafers on the first day, a difference the wafers on the second day, and a difference the wafers on the Nth day are accumulated, and it transitions, for example, as shown in FIG. 7A.

As described above, the difference in the total luminance value of the alignment image 303 of the latest inspected wafer with respect to the template image 301 is accumulated and monitored on a daily basis, so that the process change amount can be output as quantitative information, and when the difference exceeds the predetermined threshold value, an alarm indicating that the change is equal to or greater than a certain level can be provided to the user.

Next, as a method for calculating the process change amount, the method 701 of creating a histogram of the luminance of the alignment image 303 and calculating the process change amount based on the histogram will be described. Similarly to the method 700 of acquiring the total luminance from the alignment image 303 and calculating the process variation amount, after the template image 301 and the alignment image 303 of the latest wafer are aligned, the image in which the superimposed images are cut out and positions of the images match each other is formed, and the alignment calculation processing unit 70 normalizes the template image 301 and the latest alignment image 303 to generate an image.

Then, the alignment calculation processing unit 70 generates a histogram with respect to the luminance of each of the template image 301 and the alignment image 303 of the latest inspected wafer which are normalized.

As shown in FIG. 7B, the alignment calculation processing unit 70 calculates the difference by comparing the luminance histogram of the template image 301 with the luminance histogram of the alignment image 303 of the latest inspected wafer, and quantifies the information on the change of the wafer surface state with the passage of time based on the difference. For example, the number of pixels having the same luminance value is compared between the template image 301 and the latest alignment image 303, and a difference in the number of pixels is monitored as an index of the process change amount. The setting of the threshold value and the alarm notification when the threshold value is exceeded are as described above.

Finally, the method 702 of acquiring the RGB luminance ratio based on the luminance of the colors applied to the alignment image and calculating the process change amount will be described. The RGB luminance ratio herein refers to a value or a ratio acquired by comparing the luminance of each of the R (Red), the G (Green), and the B (Blue).

FIG. 8 is a detailed diagram of the alignment image capturing unit 2 in which the image processing device 67 and the alignment sensor 66 are extracted. As shown in FIG. 8, the alignment sensor 66 is, for example, a 3CCD camera for RGB, and includes sensor surfaces respectively having high sensitivity to red, green and blue. Therefore, the reflected light from the wafer 50 incident on the alignment sensor 66 is split into a plurality of beams according to wavelength bands, and the beams are received by the sensor surfaces respectively having high sensitivity, and are separated into the colors of the RGB (Red/Green/Blue) having different wavelength bands.

When the alignment image capturing unit 2 captures an alignment image, a color tone of the captured image may subtly change according to a material, a film thickness, and further, a state change of the surface of the wafer to be inspected. For example, in the case where the wafer is covered with a film, when the illumination light irradiated at the time of capturing an alignment image is reflected by the thin film, a change occurs, based on the change in the film thickness or film quality, in an optical path from the surface of the wafer due to a wavelength level of the light, and light interference occurs when an image is captured by the alignment sensor 66, and a color tone (ratio of RGB) of the image changes. By utilizing such a property, the subtle state change in the surface of the wafer covered with a film, for example, in the inspection after the film formation procedure, is quantified using the ratio of the luminance value of the RGB.

The comparison of the respective luminance of the R, the G, and the B will be described in detail. The same procedures as those up to the alignment of the template image and the alignment image captured on the latest inspected wafer are as described above. The alignment calculation processing unit 70 obtains, from each of the template image and the latest alignment image, R/G/B luminance of the pixels at the same position in the template image and the alignment image captured on the latest inspected wafer which are aligned. Any pixel located at the same position in the two images (regarding this pixel, any color represented by the pixel or any number of pixels is used) is used to calculate the process variation amount. For example, it is assumed that the uppermost left pixel is selected.

In this case, in the template image and the latest alignment image, the pixel is separated into an R (Red) component, a G (Green) component, and a B (Blue) component, and the luminance of each of the R, the G, and the B is compared between the template image and the latest alignment image to obtain a difference. For example, it is expressed as shown in FIG. 7C. In FIG. 7C, the left side of each of the R, the G, and the B is a value of the template image, and the right side thereof is a value of the latest alignment image. A value obtained by comparing the differences, which are obtained by comparing the values of the template image and the latest alignment image at each of the R, the G, and the B, in an R/G/B manner is an RGB luminance ratio. A threshold value is set for the RGB luminance ratio, and when the RGB luminance ratio exceeds a predetermined change amount, an alarm that the process change exceeds a certain amount is notified. Similarly to the other methods, not only the user is notified in the form of an alarm notification, but also the process change amount may be displayed on the image display unit 91 as the quantitative information in the form of displaying a value or a transition for each inspected wafer.

Not only the RGB which are three types of colors, but also another color may be separated from the template image and the latest alignment image, and then the luminance of the color may be compared, and the information on the change of the wafer surface state with the passage of time may be quantified based on a difference in the luminance.

As described above, according to the invention, it is possible to provide an alignment device and an alignment method that can quantitatively calculate a change in a surface state of a wafer due to a change of a semiconductor processing apparatus with passage with time and display the change in the surface state of the wafer.

According to the invention, it is possible to provide an alignment device and an alignment method that use the alignment image, which is used for the alignment of the wafer and the stage of the defect inspection apparatus as described above, in an application other than the alignment, that is, in quantifying the change (deterioration) of the semiconductor processing apparatus with passage of time and acquiring the change with the passage of time as described in the present embodiment.

In the semiconductor manufacturing line, there is a case where the process apparatus naturally deteriorates over time, and a defect that is equal to or greater than a management reference value of the manufacturing line occurs due to natural deterioration, a degree of deterioration of the process apparatus is grasped, and a maintenance cycle is optimized so that the defect equal to or greater than the management value does not occur.

Therefore, the defect inspection apparatus not only outputs the number of defects or defect positions on the wafer, but also quantifies and outputs the change amount of the wafer surface state, which contributes to prevention of the occurrence of defects and appropriate setting of the maintenance cycle.

Such quantitative information on the amount of the change of the wafer surface state with the passage of time can be said to be useful information for the user.

That is, the user can avoid stop of the inspection apparatus due to an undesired alignment error. By providing useful information to the user other than the alignment, such as notifying the user when the change amount of the wafer surface state obtained based on the change amount of the alignment image exceeds the certain amount, the user can more efficiently perform analysis of a process abnormality and an appropriate maintenance cycle.

REFERENCE SIGNS LIST

1 inspection mechanism unit
2 alignment image capturing unit
3 alignment system (alignment processing unit)
4 input and output device (information input and output unit)
5 defect determination unit
6 coordinate management device
7 stage control device
10 stage
30 auto-focus illumination unit
31 AF light receiving unit
40 light source
41 light receiving unit
50 sample (wafer)
60 alignment illumination light source
61 condenser lens
62 beam splitter
63, 65 diffusion and condenser lens
64 relay lens
66 alignment sensor
67 image processing device (alignment image processing unit)
70 alignment calculation processing unit
71 template storage processing unit
90 input unit
91 image display unit

The invention claimed is:

1. An alignment device for comparing alignment images, each of which includes an alignment mark with each other and which are captured at at least two chips of a wafer held on a stage, to align the stage and the wafer, the alignment device comprising:
the stage configured to hold the wafer;
an alignment illumination light source configured to irradiate the wafer held on the stage with light;
an alignment image processing unit configured to receive light from the wafer and acquire the alignment images of the wafer;
an information input and output unit configured to input and output information to and from a user; and
an alignment processing unit configured to process information from the alignment image processing unit and the information input and output unit, wherein
the alignment processing unit sets an alignment image captured on a first wafer as a reference image, quantifies, on the basis of a difference obtained by comparing the reference image with an alignment image captured on a second wafer, information on a change of a wafer surface state with passage of time from a time when the alignment image of the first wafer is captured to a time when the alignment image of the second wafer is captured, and displays, on the information input and output unit, the quantified information on the change of the wafer surface state with the passage of time.

2. The alignment device according to claim 1, wherein
the alignment processing unit performs calculation processing on the alignment image up to the time when the alignment image of the second wafer subjected to alignment using the reference image is captured, and generates a second reference image.

3. The alignment device according to claim 1, wherein
the alignment processing unit compares a luminance value of the reference image and a luminance value of the alignment image captured on the second wafer so as to calculate a difference, and quantifies the information on the change of the wafer surface state with the passage of time based on the difference.

4. The alignment device according to claim 3, wherein
the alignment processing unit quantifies the information on the change of the wafer surface state with the passage of time based on a difference between total luminance of the reference image and total luminance of the alignment image captured on the second wafer.

5. The alignment device according to claim 1, wherein
the alignment processing unit creates histograms of a luminance value of the reference image and luminance of the alignment image captured on the second wafer, compares these histograms so as to calculate a difference, and quantifies the information on the change of the wafer surface state with the passage of time based on the difference.

6. The alignment device according to claim 1, wherein
the alignment processing unit separates a color applied to the reference image and the alignment image captured on the second wafer into at least three types, compares the reference image with the alignment image captured on the second wafer with respect to luminance of each of the separated colors, and quantifies the information on the change of the wafer surface state with the passage of time based on a difference in luminance of each of the colors.

7. An alignment method for comparing alignment images each of which includes an alignment mark with each other and which are captured at at least two chips of a wafer held on a stage, to align the stage and the wafer, the alignment method comprising:
irradiating the wafer held on the stage with light;
receiving light from the wafer and acquiring the alignment images of the wafer; and
setting an alignment image captured on a first wafer as a reference image, quantifying, on the basis of a difference obtained by comparing the reference image with an alignment image captured on a second wafer, information on a change of a wafer surface state with passage of time from a time when the alignment image of the first wafer is captured to a time when the alignment image of the second wafer is captured, and displaying, on the information input and output unit, the quantified information on the change of the wafer surface state with the passage of time.

8. The alignment method according to claim 7, further comprising:
performing calculation processing on the alignment image up to the time when the alignment image of the second wafer subjected to alignment using the reference image is captured, and generating a second reference image.

9. The alignment method according to claim 7, further comprising:
comparing a luminance value of the reference image and a luminance value of the alignment image captured on the second wafer so as to calculate a difference, and quantifying the information on the change of the wafer surface state with the passage of time based on the difference.

10. The alignment method according to claim 9, further comprising:
quantifying the information on the change of the wafer surface state with the passage of time based on a difference between total luminance of the reference image and total luminance of the alignment image captured on the second wafer.

11. The alignment method according to claim 7, further comprising:
creating histograms of a luminance value of the reference image and luminance of the alignment image captured on the second wafer, comparing these histograms so as to calculate a difference, and quantifying the information on the change of the wafer surface state with the passage of time based on the difference.

12. The alignment method according to claim 7, further comprising:
separating a color applied to the reference image and the alignment image captured on the second wafer into at least three types, comparing the reference image with the alignment image captured on the second wafer with respect to luminance of each of the separated colors, and quantifying the information on the change of the wafer surface state with the passage of time based on a difference in luminance of each of the colors.

* * * * *